United States Patent [19]
Yoshihara

[11] Patent Number: 5,471,071
[45] Date of Patent: Nov. 28, 1995

[54] SEMICONDUCTOR STATIC RANDOM ACCESS MEMORY STRUCTURE

[75] Inventor: Ikuo Yoshihara, Kanagawa, Japan

[73] Assignee: Sony Corporation, Tokyo, Japan

[21] Appl. No.: 310,628

[22] Filed: Sep. 22, 1994

Related U.S. Application Data

[63] Continuation of Ser. No. 656,596, Feb. 19, 1991, Pat. No. 5,350,933.

[30] Foreign Application Priority Data

Feb. 21, 1990 [JP] Japan ................................. 2-040666
Oct. 26, 1990 [JP] Japan ................................. 2-290162

[51] Int. Cl.⁶ ............................................. H01L 29/10
[52] U.S. Cl. ........................... 257/69; 257/351; 257/390; 257/903
[58] Field of Search ........................... 257/69, 351, 390, 257/903

[56] References Cited

U.S. PATENT DOCUMENTS

| | | | |
|---|---|---|---|
| 4,404,578 | 12/1983 | Takafuji et al. | 257/72 |
| 4,570,175 | 2/1986 | Miyao et al. | 257/70 |
| 4,724,530 | 2/1988 | Dingwall | 257/351 |
| 4,980,732 | 12/1990 | Okazawa | 257/903 |
| 5,083,190 | 1/1992 | Pfiester | 257/903 |
| 5,095,347 | 3/1992 | Kirsch | 257/903 |
| 5,132,771 | 7/1992 | Yamanaka et al. | 257/390 |
| 5,134,581 | 7/1992 | Ishibashi et al. | 365/154 |
| 5,281,828 | 1/1994 | Muragishi | 257/903 |

*Primary Examiner*—Robert P. Limanek
*Attorney, Agent, or Firm*—Hill, Steadman & Simpson

[57] ABSTRACT

A pair of load transistors of a flip-flop circuit constituting a memory cell consist of thin film transistors, and channel regions of the pair of load transistors overlap drain regions of the transistors through a gate insulating film. For this reason, a channel length of the load transistor can be sufficiently increased, and a leakage current of the load transistor can be reduced.

1 Claim, 8 Drawing Sheets

SEMICONDUCTOR STATIC RANDOM ACCESS MEMORY STRUCTURE

This is a continuation of application Ser. No. 07/656,596, filed Feb. 19, 1991, now U.S. Pat. No. 5,350,933.

BACKGROUND OF THE INVENTION

1. Field of the Invention

The present invention relates to a semiconductor memory and, more particularly to a semiconductor memory which is preferably applied to a full CMOS static RAM.

2. Description of the Prior Art

In a stacked full CMOS static RAM obtained by stacking a load transistor consisting of a thin film transistor (TFT) on a driver transistor, low power consumption and good data retention characteristics can he obtained, and an integration density can he increased by stacking transistors. Therefore, the static RAM has received a great deal of attention in recent years.

A stacked full CMOS static RAM having a structure obtained by stacking load transistors consisting of TFTs on the gate electrode of a driver transistor using the gate electrode in common is proposed (Nikkei Micro Device, September issuer 1988, pp. 123–1130).

A stacked full CMOS static RAM in which the gate electrode of a driver transistor and the gate electrode of a load transistor consisting of a TFT are independently formed to make the channel length of the load transistor to he longer than the channel length of the driver transistor is proposed (IEDM, 1988, pp. 48–59).

In the conventional stacked full CMOS static RAM including a structure obtained by stacking a load transistor consisting of a TFT on a driver transistor so as to use a gate electrode in common, since the load transistor has an offset gate structure, a leakage current of the load transistor can be suppressed. However, the leakage current can not be satisfactorily reduced.

In the conventional stacked full CMOS static RAM in which the gate electrode of the driver transistor and the gate electrode of the load transistor are independently formed so as to increase the channel length of the load transistor, a channel length of 1.5 μm or more required for reducing a leakage current is difficult to assure.

OBJECTS AND SUMMARY OF THE INVENTION

It is, therefore, an object of the present invention to provide a semiconductor memory capable of largely reducing a leakage current of the load transistor by increasing a channel length of the load transistor consisting of a TFT.

It is another object of the present invention to provide a semiconductor memory capable of preventing a defect caused by an error of alignment of semiconductor thin films for constituting load transistors.

According to the semiconductor memory of the present invention, since a pair of load transistors of a second conductivity type are formed by semiconductor thin films such that channel regions and the drain regions of the pair of load transistors of the second conductivity type overlap through a gate insulating film, the drain region of one load transistor is used as the gate electrode of the other load transistor. For this reason, since the gate length of the load transistor can be sufficiently increased, a leakage current of the load transistor can be largely reduced.

Since the widths of the semiconductor thin films are larger at a portion of the drain region than at a portion of the channel region, the following defect caused by an error of alignment of the semiconductor thin films can be effectively prevented. That is, the gate electrode formed in the upper semiconductor thin film is not entirely formed on a channel region formed in the lower semiconductor thin film, and a channel region formed in the upper semiconductor thin film is not entirely formed on the gate electrode formed in the lower semiconductor thin film.

DETAILED DESCRIPTION OF PREFERRED EMBODIMENTS

The first to third embodiments will be described below with reference to the accompanying drawings.

An arrangement of a memory cell of a full CMOS static RAM will be described first.

Figure 1:
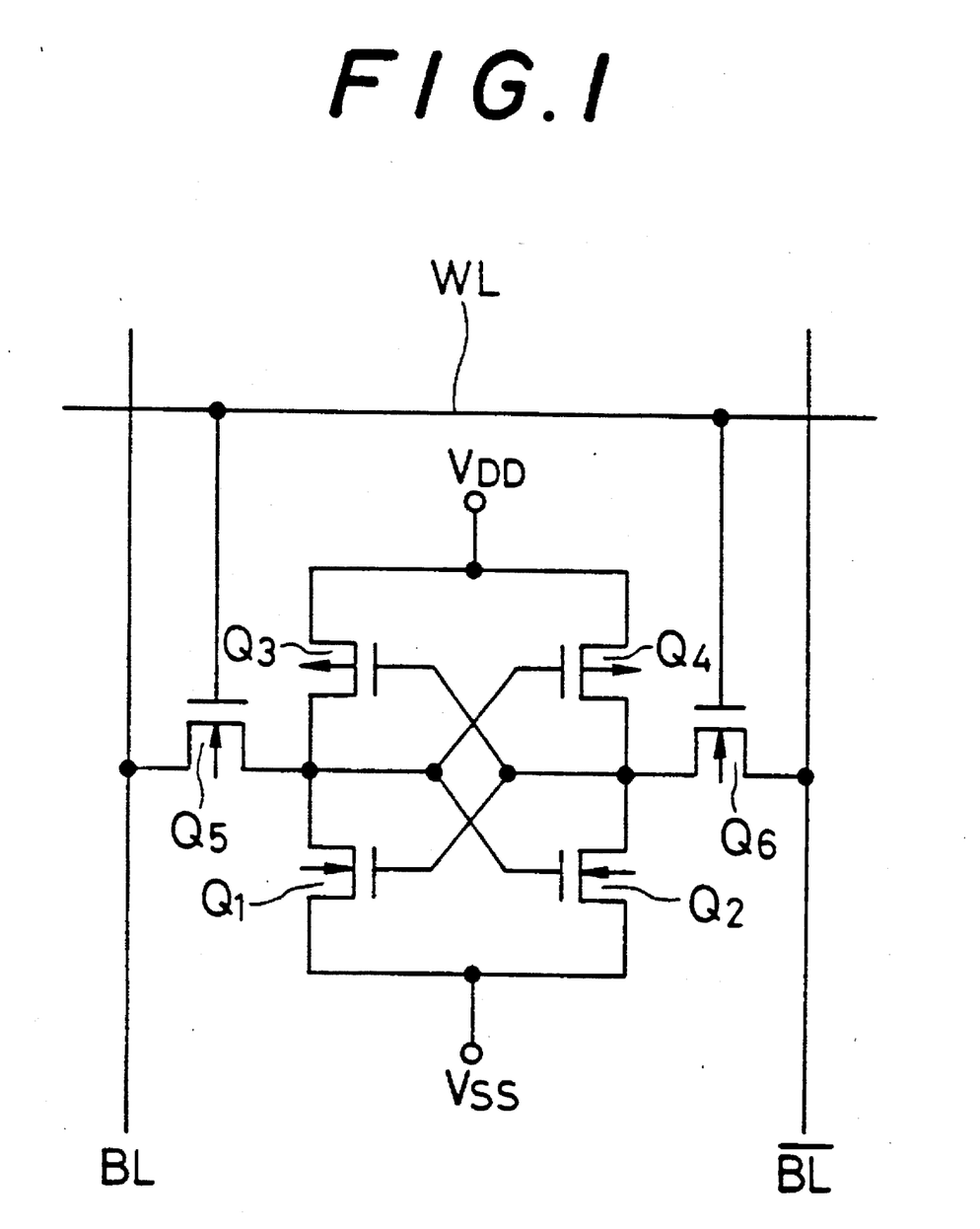
FIG. 1 is a circuit diagram showing an equivalent circuit of a memory cell of a full CMOS static RAM.

As shown in FIG. 1, the memory cell of the full CMOS static RAM comprises a flip-flop circuit including a pair of driver transistors $Q_1$ and $Q_2$ and a pair of load transistors $Q_3$ and $Q_4$, and a pair of access transistors $Q_5$ and $Q_6$ for exchanging data with the outside of the cell. Reference symbol WL denotes a word line, and reference symbols BL and $\overline{BL}$ denote bit lines. Reference symbols $V_{DD}$ and $V_{ss}$ denote power sources.

A practical structure of a stacked full CMOS static RAM according to the first embodiment will be described below.

Figure 2:
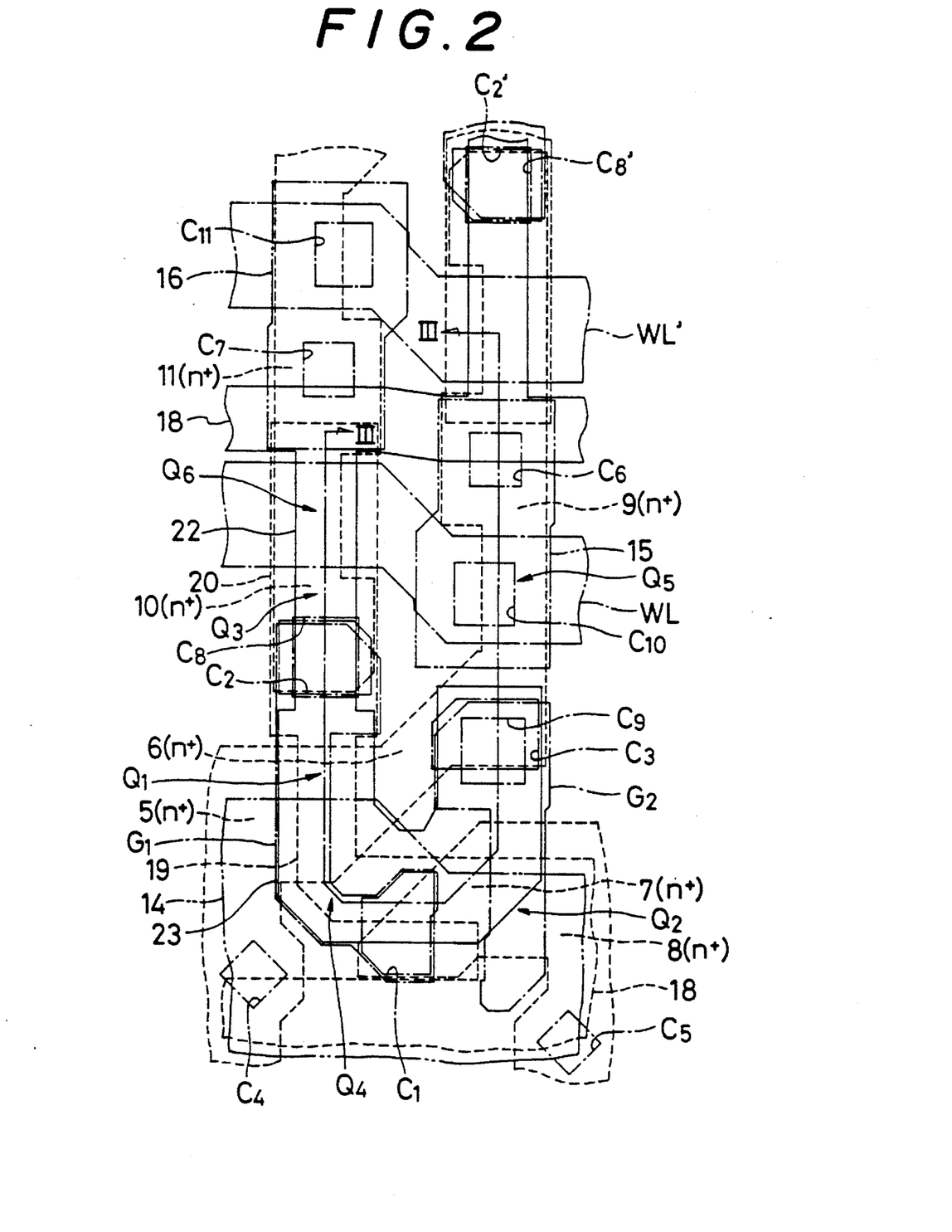
FIG. 2 is a plan view showing a stacked full CMOS static RAM according to the first embodiment of the present invention.
Figure 3:
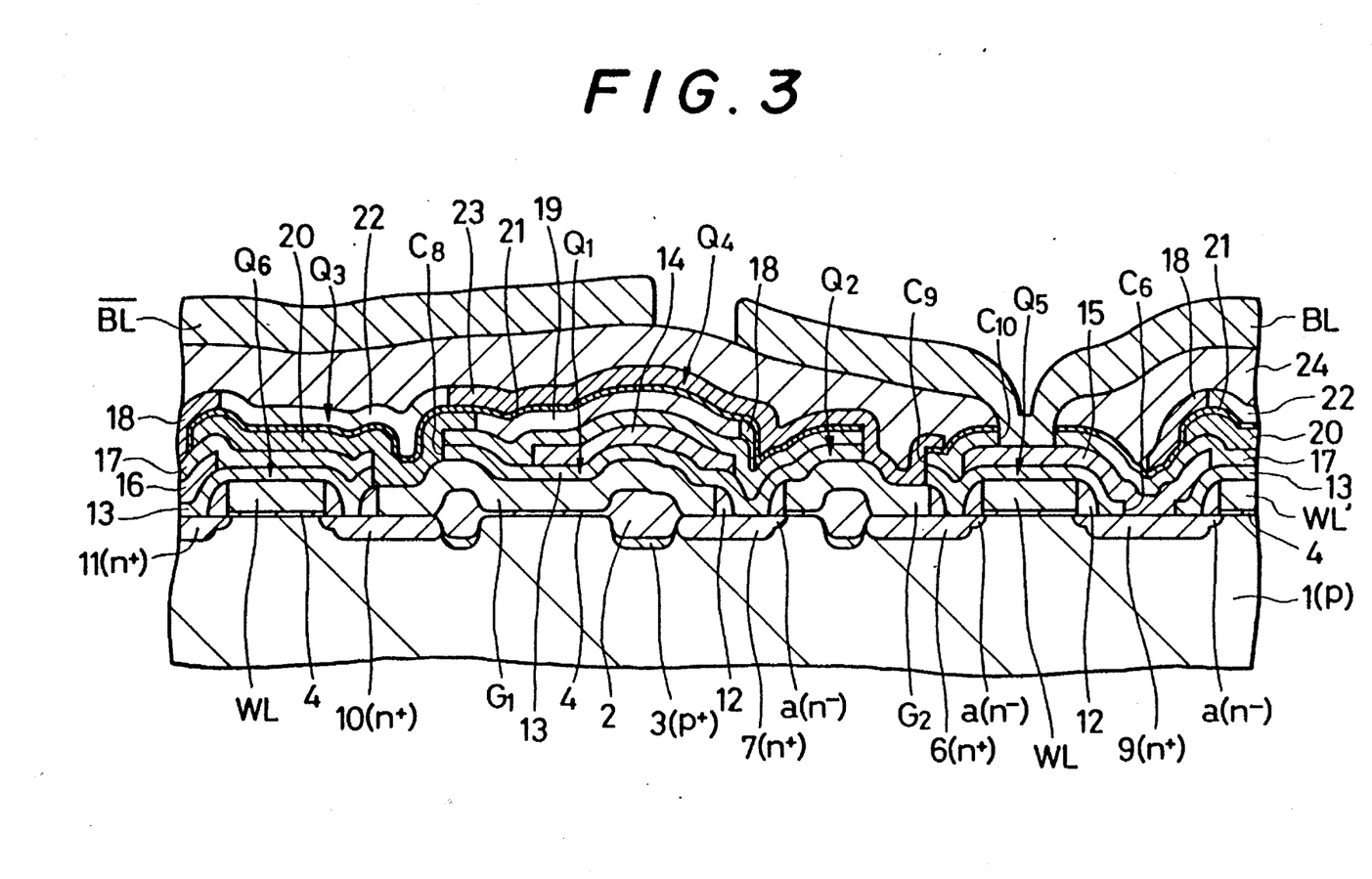
FIG. 3 is a sectional view showing the static RAM along a line III—III in FIG. 2.

As shown in FIGS. 2 and 3, in the first embodiment, a field insulating film 2 such as an $SiO_2$ film is selectively formed on the surface of a semiconductor substrate 1 such as a p-type silicon (Si) substrate to isolate elements from each other. A $p^+$-channel stop region 3 is formed below the field insulating film 2. A gate insulating film 4 such as an $SiO_2$ film is formed on the surface of an active region surrounded by the field insulating film 2.

Reference symbols $G_1$ and $G_2$ denote the gate electrodes of the driver transistors $Q_1$ and $Q_2$, and reference symbols WL and WL' denote word lines. The gate electrodes $G_1$ and $G_2$ and the word lines WL and WL' are formed by an $n^+$-type polysilicon film of a first layer obtain by doping an n-type impurity such as phosphorus (P) or a polycide film obtained by stacking a refractory metal silicide film such as a tungsten silicide ($WSi_2$) film on the $n^+$-type polysilicon film of the first layer.

In the active region surrounded by the field insulating film 2, $n^+$-type diffusion layers 5 to 11 for +constituting source or drain regions are formed. The driver transistor $Q_1$ consisting of an n-channel MOS transistor is formed by the gate electrode $G_1$ and the diffusion layers 5 and 6. Similarly, the driver transistor $Q_2$ consisting of an n-channel MOS transistor is formed by the gate electrode $G_2$ and the diffusion layers 7 and 8. The access transistor $Q_5$ consisting of an n-channel MOS transistor is formed by the word line WL and the diffusion layers 6 and 9, and the access transistor $Q_6$ consisting of an n-channel MOS transistor is formed by the word line WL and the diffusion layers 10 and 11.

In this case, side wall spacers 12 consisting of, e.g., $SiO_2$ are formed on the side walls of the gate electrodes $G_1$ and $G_2$ and the word lines WL and WL'. An $n^-$-type low-concentration impurity portion a is formed below the side wall spacer 12. Therefore, the driver transistors $Q_1$ and $Q_2$ and the access transistors $Q_5$ and $Q_6$ have an LDD (lightly doped drain) structure.

Reference symbols $C_1$ to $C_3$ denote contact holes for buried contacts. One end of the gate electrode $G_1$ of the driver transistor $Q_1$ is in contact with the diffusion layer 7 of the driver transistor $Q_2$ through the contact hole $C_1$, and the other end is in contact with the diffusion layer 10 of the access transistor $Q_6$ through the contact hole $C_2$. The gate electrode $G_2$ of the driver transistor $Q_2$ is in contact with the diffusion layer 6 of the driver transistor $Q_1$ and the access transistor $Q_5$ through the contact hole $C_3$.

Reference numeral 13 denotes an insulating interlayer such as a phosphosilicate glass (PSG) film or an $SiO_2$ film. Reference symbols $C_4$ and $C_5$ denote contact holes for buried contacts formed in the insulating interlayer 13. Reference numeral 14 denotes a ground power source line for supplying a power source voltage $V_{ss}$. The ground power source line 14 consists of, e.g., an $n^+$-type polysilicon film of a second layer obtained by doping an n-type impurity such as phosphorus at a high concentration, or a polycide film obtained by stacking a refractory metal silicide film on the $n^{30}$-type polysilicon film of the second layer. The ground power source line 14 is in contact with the diffusion layer 5 of the driver transistor $Q_1$ through the contact hole $C_4$ and in contact with the diffusion layer 8 of the driver transistor $Q_2$ through the contact hole $C_5$.

Reference numerals 15 and 16 denote relay wirings. As the ground power source line 14, the relay wirings 15 and 16 consist of, e.g., an $n^+$-type polysilicon film of the second layer obtained by doping an n-type impurity such as phosphorus at a high concentration, or a polycide film obtained by stacking a refractory metal silicide film on the $n^+$-type polysilicon film of the second layer. In this case, the relay wiring 15 is in contact with the diffusion layer 9 of the access transistor $Q_5$ through the contact hole $C_6$ for a buried contact. The relay wiring 16 is in contact with the diffusion layer 11 of the access transistor $Q_6$ through the contact hole $C_7$ for a buried contact.

Reference numeral 17 denotes an insulating interlayer such as a PSG film or an $SiO_2$ film. Reference numeral 18 denote a power source line for supplying a power source voltage $V_{DD}$. The power source line 18 consists of $p^+$-type polysilicon films of third and fourth layers obtained..by doping-a p-type impurity such as boron (B) at a high concentration.

Reference numeral 19 denotes an n-type channel region of the load transistor $Q_4$, and reference numeral 20 denotes a $p^+$-type drain region of the load transistor $Q_4$. In this case, the drain region 20 also serves as the gate electrode of the load transistor $Q_3$. The channel region 19 and the drain region 20 consist of, e.g., the polysilicon film of the third layer.

Reference numeral 21 denotes a gate insulating film such as an $SiO_2$ film. Reference numeral 22 denotes, e.g., an n-channel region of the load transistor $Q_3$, and reference numeral 23 denotes, e.g., a $p^+$-type drain region. In this case, the drain region 23 also serves as the gate electrode of the load transistor $Q_4$. The channel region 22 and the drain region 23 consist of, e.g., the polysilicon film of the fourth layer.

In the first embodiment, the polysilicon film of the third layer constituting the load transistor $Q_4$ has a width larger at the drain region 20 than at the channel region 19. The drain region 23 serving as the gate electrode of the load transistor $Q^4$ entirely covers the channel region 19. The polysilicon film of the fourth layer constituting the load transistor $Q_3$ has a width larger at the portion of the drain region 23 than at the channel region 22. The channel region 22 of the load transistor $Q_3$ is entirely formed on the drain region 20 serving as the gate electrode of the load transistor $Q_3$. In addition, one end of the drain region 20 serving as the gate electrode of the load transistor $Q_3$ overlaps one end of the drain region 23 serving as the gate electrode of the load transistor $Q_4$.

Reference symbols $C_8$ and $C_9$ denote contact holes for buried contacts formed in the insulating interlayers 13 and 17. The drain region 20 also serving as the gate electrode of the load transistor $Q_3$ is in contact with the gate electrode $G_1$ of the driver transistor $Q_1$ through the contact hole $C_8$. The drain region 23 also serving as the gate electrode of the load transistor $Q_4$ is in contact with the gate electrode $G_2$ of the driver transistor $Q_2$ through the contact hole $C_9$.

Reference numeral 24 denotes an insulating interlayer such as a PSG film. Reference symbols $C_{10}$ and $C_{11}$ denote contact holes formed in the insulating interlayers 24 and 17, respectively. The contact hole $C_{10}$ is formed on the access transistor $Q_5$. The contact hole $C_{11}$ is formed on an access transistor of an adjacent memory cell using the word line WL'. The bit line BL consisting of, e.g., an aluminum (Al) wiring is in contact with the relay wiring 15 through the contact hole $C_{10}$. As described above, since the relay wiring 15 is in contact with the diffusion layer 9 of the access transistor $Q_5$ through the contact hole $C_6$, the bit line BL is connected to the diffusion layer 9 of the access transistor $Q_5$ through the relay wiring 15. Similarly, the bit line BL is in contact with the relay wiring 16 through the contact hole $C_{11}$. Since the relay wiring 16 is in contact with the diffusion layer 11 of the access transistor $Q_6$ through the contact hole $C_7$, the bit line $\overline{BL}$ is connected to the diffusion layer 11 of the access transistor $Q_6$ through the relay wiring 16. Note that the bit lines BL and $\overline{BL}$ extend perpendicularly to the word line WL.

A method of manufacturing a stacked full CMOS static RAM with the above arrangement according to the first embodiment will be described below.

As shown in FIGS. 2 and 3, the surface of the semiconductor substrate 1 is selectively and thermally oxidized to form the field insulating film 2 so as to isolate elements from each other. In this case, a p-type-impurity such as boron (B) ion-implanted in the semiconductor substrate 1 in advance is diffused to form, e.g., the $p^+$-type channel stop region 3 below the field insulating film 2. The gate insulating film 4 is formed by a thermal oxidation method on the surface of the active region surrounded by field insulating film 2. The gate insulating film 4 and the field insulating film 2 are removed by etching from predetermined portions to form the contact holes $C_1$ to $C_3$.

A polysilicon film of the first layer is formed on the entire surface of the resultant structure by the CVD method, and an impurity such as phosphorus (P) is doped in the polysilicon film at a high concentration by a thermal oxidation method or an ion implantation method to make the polysilicon film to have a low resistance. Thereafter, the polysilicon film is etched to be patterned into a predetermined shape, thereby forming the gate electrodes $G_1$ and $G_2$ and the word lines WL and WL'. An n-type impurity such as phosphorus (P) is ion-implanted in the semiconductor substrate 1 at a low concentration using the gate electrodes $G_1$ and $G_2$ and the word lines WL and WL' as masks. After an $SiO_2$ film is formed on the entire surface by the CVD method, the $SiO_2$ film is etched perpendicularly to the substrate surface by, e.g., a reactive ion etching (RIE) method to form the side wall spacers 12 on the side walls of the gate electrodes $G_1$ and $G_2$ and the word lines WL and WL'.

An n-type impurity such as arsenic (As) is ion-implanted in the semiconductor substrate i at a high concentration using the side wall spacers 12, the gate electrodes $G_1$ and $G_2$, and the word lines WL and WL' as masks. Thereafter, annealing for electrically activating the implanted impurity is performed. Thus, the diffusion layers 5 to 11 having low-concentration impurity portions a are formed below the side wall spacers 12.

After the insulating interlayer 13 is formed on the entire surface by the CVD method, a predetermined portion of the insulating interlayer 13 is removed by etching to form the contact holes $C_4$, $C_5$, $C_6$, and $C_7$.

A polysilicon film of the second layer is formed on the entire surface of the resultant structure by a CVD method, and an impurity such as phosphorus (P) is doped in the polysilicon film at a high concentration to make the polysilicon film to have a low resistance. Thereafter, the polysilicon film is etched to be patterned into a predetermined shape so as to form the ground power source line 14 and the relay wirings 15 and 16.

After the insulating interlayer 17 is formed on the entire surface by a CVD method, predetermined portions of the insulating interlayers 17 and 13 are removed by etching to form a contact hole $C_8$. The polysilicon film of the third layer is formed on the entire surface by the CVD method, and an n-type impurity such as phosphorus (P) is doped in the polysilicon film at a low concentration. Thereafter, the surface of a portion of the polysilicon film prospectively serving as the channel region 19 of the load transistor $Q_4$ is covered with a resist pattern (not shown), and a p-type impurity such as boron (B) is ion-implanted in the polysilicon film at a high concentration using the resist pattern as a mask. Thereafter, the resist pattern is removed. The polysilicon film of the third layer is etched to be patterned into a predetermined shape so as to form the wiring 18 for supplying the power source voltage $V_{DD}$, the n-type channel region 19, and the $p^+$-type drain region 20

The gate insulating film 21 is formed on the entire surface by, e.g., a CVD method. Note that the gate insulating film 21 can also be formed by, e.g., a thermal oxidation method. Thereafter, predetermined portions of the gate insulating film 21 and the insulating interlayers 17 and 13 are removed by etching to form the contact hole $C_9$. The polysilicon film of the fourth layer is formed on the entire surface by the CVD method, and an n-type impurity such as phosphorus (P) is doped in the polysilicon film at a low concentration. Thereafter, the surface of a portion of the polysilicon film prospectively serving as the channel region 22 of the load transistor $Q_3$ is covered with a resist pattern (not shown), and a p-type impurity such as boron (B) is ion-implanted in the polysilicon film at a high concentration using the resist pattern as a mask. Thereafter, the resist pattern is removed. The polysilicon film of the fourth layer patterned into a predetermined shape by etching to form the wiring 18 for supplying the power source voltage $V_{DD}$, the n-type channel region 22, and the $p^+$-type drain region 23.

After the insulating interlayer 24 is formed on the entire surface by a CVD method, predetermined portions of the insulating interlayers 24 and 17 are removed by etching to form the contact holes $C_{10}$ and $C_{11}$.

After the Al film is formed on the entire surface by, e.g., a sputtering method, the Al film is patterned into a predetermined shape by etching to form the bit lines BL and $\overline{BL}$, thereby completing a target stacked full CMOS static RAM.

As described above, according to the first embodiment, since the channel regions 19 and 22 and the drain regions 20 and 23 of the load transistors $Q_3$ and Q4 consisting of p-channel TFTs are stacked on each other through the gate insulating film 21, the channel lengths of the load transistors $Q_3$ and $Q_4$ can be sufficiently increased compared with a structure in which the load transistors $Q_3$ and $Q_4$ are two-dimensionally arranged.

More specifically, for example, the channel lengths of the load transistors $Q_3$ and $Q_4$ can be four times those of the driver transistors $Q_1$, and $Q_2$ consisting of n-channel MOS transistors. For example, when the channel length of each of the driver transistors $Q_1$ and $Q_2$ is set to be 0.5 μm, the channel length of each of the load transistors $Q_3$ and $Q_4$ can be 2 μm or more. Therefore, a leakage current of the load transistors $Q_3$ and $Q_4$ can be largely reduced. For example, when the thickness of the polysilicon film constituting the load transistors $Q_3$ and $Q_4$ is set to be 500 Å, and the channel width and the channel length are set to be 10 μm and 2 to 3 μm, respectively, the leakage current of the load transistors $Q_3$ and $Q_4$ can be reduced to $10^{-11}$ A. Note that the gate voltage is set to be 0 V, and the drain voltage is set to be −4 V.

Since each of the drain regions 20 and 23 has a width larger than that of each of the channel regions 19 and 22, a defect caused by an error of alignment between the polysilicon films of the third and fourth layers constituting the load transistors $Q_3$ and $Q_4$ can be effectively prevented.

In addition, since the drain regions 20 and 23 serving as the gate electrodes of the load transistors $Q_3$ and $Q_4$ overlap each other, a capacitance of this overlapping portion can improve resistance to a soft error.

Figure 4:
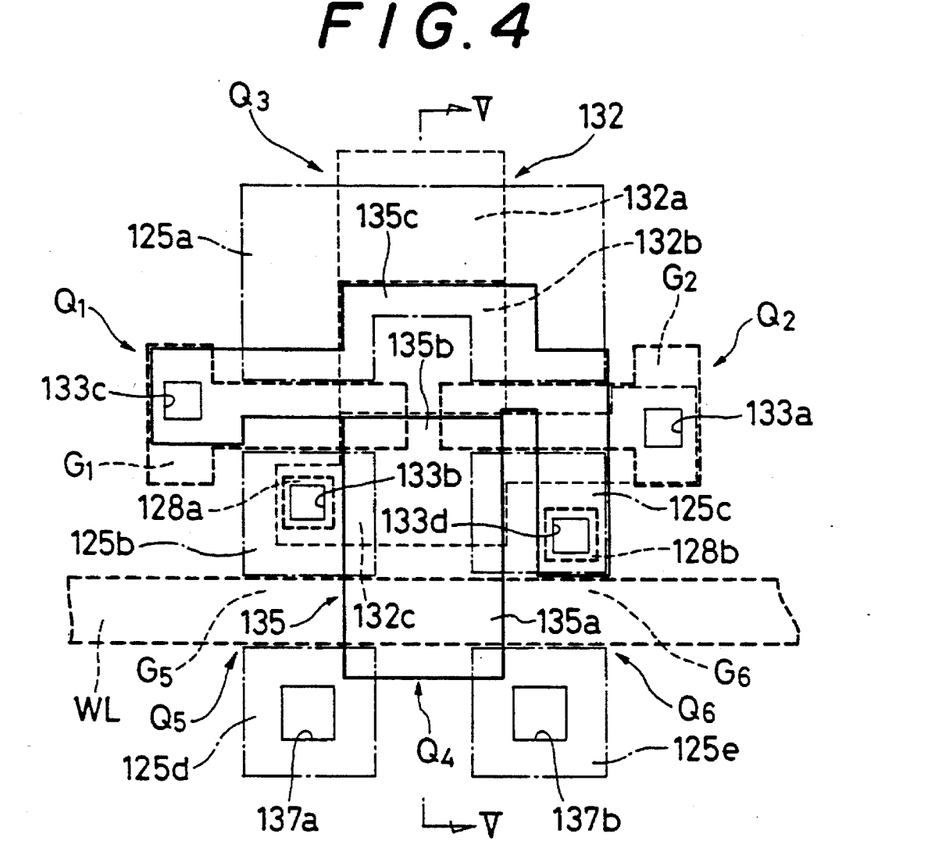
FIG. 4 is a plan view showing a stacked full CMOS static RAM according to the second embodiment of the present invention.
Figure 6:
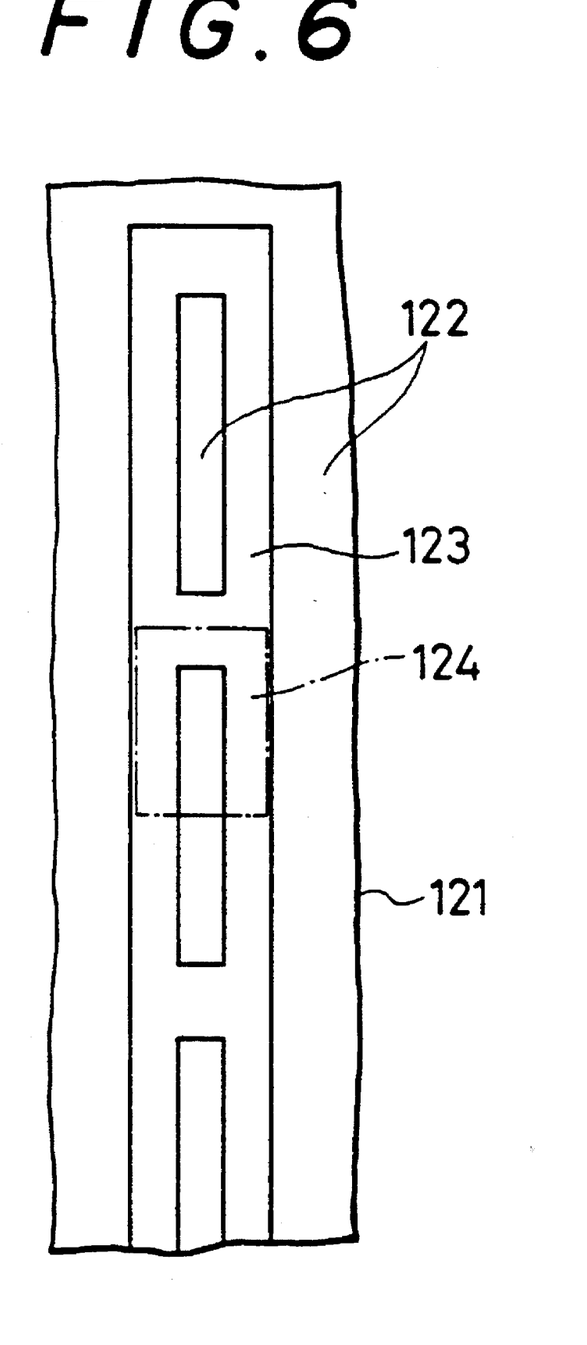
FIG. 6 is a plan view showing a semiconductor substrate for manufacturing the static RAM according to the second embodiment.

FIGS. 4 and 6 show the second embodiment. In the second embodiment, driver transistors $Q_1$ and $Q_2$ and access transistors $Q_5$ and $Q_6$ consist of bulk transistors, and load transistors $Q_3$ and $Q_4$ consist of thin film transistors.

In the second embodiment, as shown in FIG. 6, a LOCOS film 122 is formed on the surface of an Si substrate 121, and a region surrounded by the LOCOS film 122 is to be an active region 123. Note that one memory cell 124 is formed on a portion indicated by the alternate long and short dashed line in FIG. 6, and this portion corresponds to a portion in FIG. 4.

In the active region 123 of the Si substrate 121, $n^+$-type regions 125a to 125e serving as source/drain regions of the transistors $Q_1$, $Q_2$, $Q_5$, and $Q_6$ are formed.

Gate electrodes $G_1$, $G_2$, $G_5$, and $G_6$ of the transistors $Q_1$, $Q_2$, $Q_5$, and $Q_6$ are formed on a gate insulating film 126 of the surface of the active region 123 and on the LOCOS film 122 by a polysilicon film of a first layer or a polycide film. Note that the gate electrodes $G_5$ and $G_6$ are a part of a word line WL.

The gate insulating film 126 is removed from a portion where the $n^+$-type regions 125a and 125c are connected to the drain regions of the transistors $Q_3$ and $Q_4$, and polycide films 128a and 128b are left on the portion.

Figure 5:
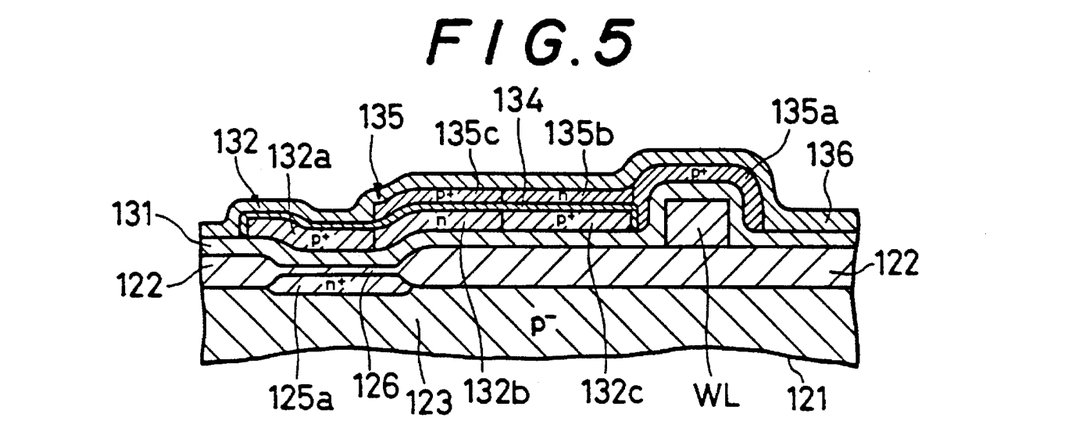
FIG. 5 is a sectional view showing the static RAM along a line V—V in FIG. 4.

The gate electrodes $G_1$ and $G_2$ and the word line WL are covered with an insulating interlayer 131 consisting of an $SiO_2$ film, and a polysilicon thin film 132 for the transistor $Q_3$ is formed on the insulating interlayer 131 by a polysilicon film of a second layer.

In the transistor $Q_3$, a $p^+$-type region 132a, an n-type region 132b, and a p+-type region 132c serve as a source region, a channel region, and a drain region, respectively. The $p^+$-type region 132c is connected to the gate electrode $G_2$ and a silicide film of the polycide film 128a through contact holes 133a and 133b formed in the insulating interlayer 131. Therefore, the $p^+$-type region 132c is connected to the $n^+$-type region 125b through the polycide film 128a.

The surface of the polysilicon thin film 132 is covered with a gate insulating film 134, and a polysilicon thin film 135 for the transistor $Q_4$ is formed on the gate insulating film 134 or the like by a polysilicon film of a third layer.

In the transistor $Q_4$, a $p^+$-type region 135a, an n-type region 135b, and a $p^+$-type region 135c serve as a source region, a channel region, and a drain region, respectively. The $p^+$-type region 135c is connected to the gate electrode $G_1$ and a silicide film of the polycide film 128b through contact holes 133c and 133d formed in the insulating interlayer 131. Therefore, the $p^+$-type region 135c is connected to the $n^+$-type region 125c through the polycide film 128b.

As is apparent from FIGS. 4 and 5, the n-type region 132b of the transistor $Q_3$ and the $p^+$-type region 135c of the transistor $Q_4$ overlap through the gate insulating film 134, and the $p^+$-type region 132c of the transistor $Q_3$ and the n-type region 135b of the transistor $Q_4$ overlap through the gate insulating film 134.

Therefore, the $p^+$-type region 135c of the transistor $Q_4$ serves as the gate electrode of the transistor $Q_3$, and the $p^+$-type region 132c of the transistor $Q_3$ serves as the gate electrode of the transistor $Q_4$.

The polysilicon thin film 135 or the like is covered by an insulating interlayer 136 consisting of an $SiO_2$ film. Contact holes 137a and 137b reaching the $n^+$-type regions 125d and 125e are formed in the insulating interlayers 136 and 131 and the gate insulating film 126, and bit lines BL and $\overline{BL}$ made of Al are connected to the $n^+$-type regions 125d and 125e through the contact holes 137a and 137b.

A power source line for supplying a voltage $V_{DD}$ may be obtained by extending the $p^+$-type regions 132a and 135a, and an Al wire may be connected to the $p^+$-type regions 132a and 135a. A power source line for supplying a voltage $V_{ss}$ may be obtained by connecting any one of the polysilicon wire and the Al wire to the $n^+$-type region 125a.

Figure 7:
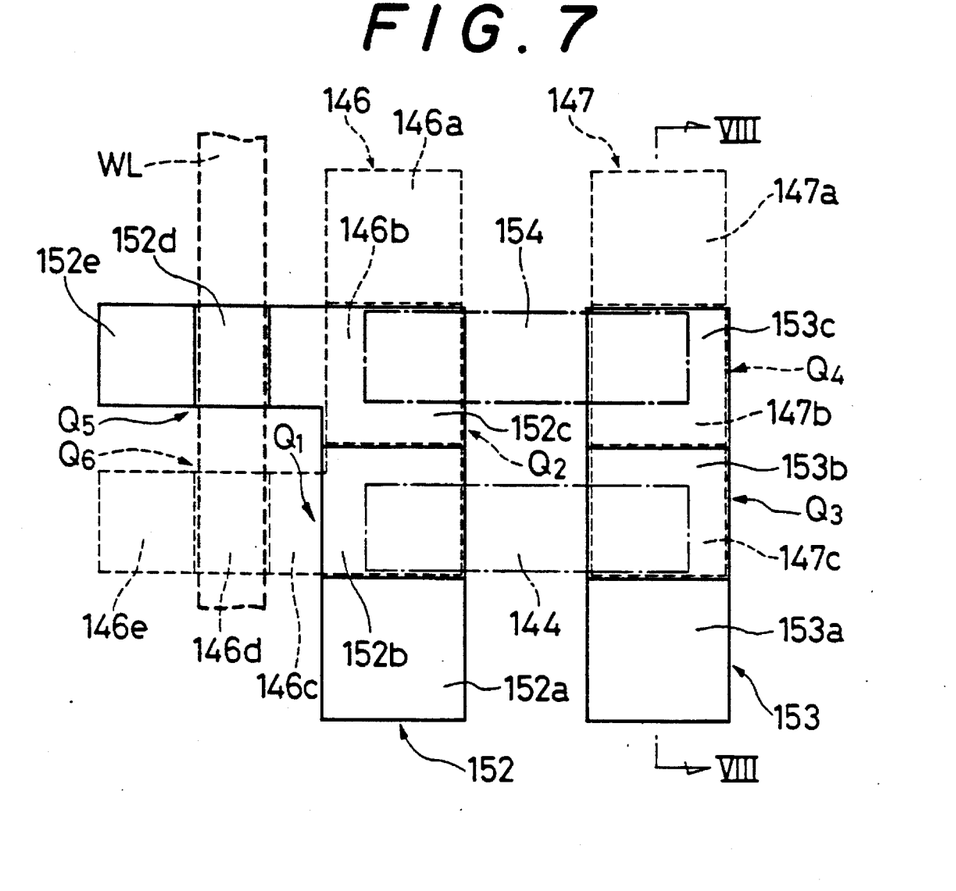
FIG. 7 is a plan view showing a stacked full CMOS static RAM according to the third embodiment of the present invention.
Figure 8:
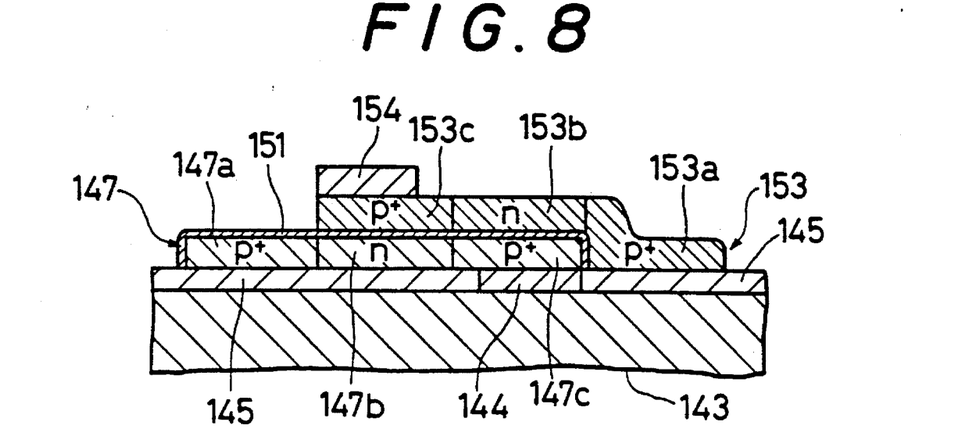
FIG. 8 is a side sectional view showing the static RAM along a line VIII—VIII in FIG. 7.

FIGS. 7 and 8 show the third embodiment. In the third embodiment, driver transistors $Q_1$ and load transistors $Q_3$ and $Q_4$, and access transistors $Q_5$ and $Q_6$ consist of thin film transistors.

In this third embodiment, a silicide film 144 is patterned on an $SiO_2$ substrate 143, and it is flattened by a flattening film 145 consisting of an $SiO_2$ film. A word line WL is formed on the flattening film 145 by a polysilicon film of a first layer, and the surface of the word line WL is covered with a gate insulating film (not shown).

A polysilicon thin film 146 for transistors $Q_2$ and $Q_6$ and a polysilicon thin film 147 for a transistor $Q_4$ are formed on the gate insulating film of the silicide film 144, the word line WL, or the like by a polysilicon film of a second layer.

In the transistor $Q_2$, an $n^+$-type region 146a, a p-type region 146b, and an $n^+$-type region 146c serve as a source region, a channel region, and a drain region, respectively. In the transistor $Q_6$, an $n^+$-type region 146c, a p-type region 146d, and an $n^+$-type region 146e serve as a source region, a channel region, and a drain region, respectively. In the transistor $Q_4$, a $p^+$-type region 147a, an n-type region 147b, and a $p^+$-type region 147c serve as a source region, a channel region, and a drain region, respectively. The $n^+$-type region 146c and the $p^+$-type region 147c are connected to each other through the silicide film 144.

The surfaces of the polysilicon thin films 146 and 147 are covered with a gate insulating film 151, and a polysilicon thin film 152 for the transistors $Q_1$, and $Q_5$ and a polysilicon thin film 153 for the transistor $Q_3$ are formed on the gate insulating film 151 or the like by a polysilicon film of a third layer.

In the transistor $Q_1$, an n+-type region 152a, a p-type region 152b, and an $n^+$-type region 152c serve as a source region, a channel region, and a drain region, respectively. In the transistor $Q_5$, an $n^+$-type region 152c, a p-type region 152d, and an $n^+$-type region 152e serve as a source region, a channel region, and a drain region, respectively. In the transistor $Q_3$, $p^+$-type region 153a, an n-type region 153b, and a $p^+$-type region 153c serve as a source region, a channel region, and a drain region, respectively.

The silicide film 154 is patterned on the polysilicon thin films 152 and 153, and the like, and the $n^+$-type region 152c and the $p^+$-type region 153c are connected to each other through the silicide film 154.

As is apparent from FIGS. 7 and 8, the n-type region 147b of the transistor $Q_4$ and the $p^+$-type region 153c of the transistor $Q_3$ overlap through the gate insulating film 151, and the $p^+$-type region 147c of the transistor $Q_4$ and the n-type region 153b of the transistor $Q_3$ overlap through the gate insulating film 151.

Therefore, the $p^+$-type region 153c of the transistor $Q_3$ serves as the gate electrode of the transistor $Q_4$, and the $p^+$-region 147c of the transistor $Q_4$ serves as the gate electrode of the transistor $Q_3$.

The p-type region 146b of the transistor $Q_2$ and the $n^+$-type region 152c of the transistor $Q_1$ overlap through the gate insulating film 151, and the $n^+$-type region 146c of the transistor $Q_2$ and the p-type region 152b of the transistor $Q_1$ overlap through the gate insulating film 151.

Therefore, the $n^+$-type region 152c of the transistor $Q_1$ serves as the gate electrode of the transistor $Q_2$, and the $n^+$-type region 146c of the transistor $Q_2$ serves as the gate electrode of the transistor $Q_1$.

Bit lines BL and $\overline{BL}$ are connected to the $n^+$-type regions 152e and 146e, respectively. A power source line for supplying a voltage $V_{DD}$ is connected to the $p^+$-type regions 147a and 153a, and a power source line for supplying a voltage $V_{ss}$ is connected to the $n^+$-type regions 146a and 152a.

Figure 9:
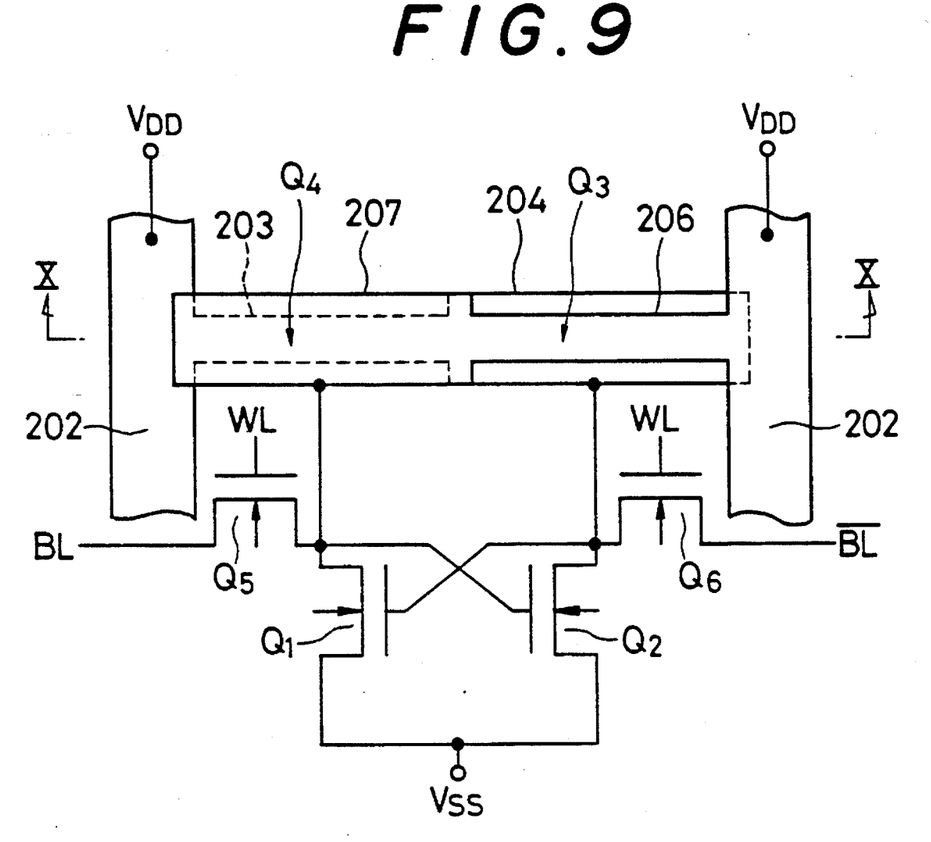
FIG. 9 is a schematic view showing a memory cell according to the first embodiment.
Figure 10:
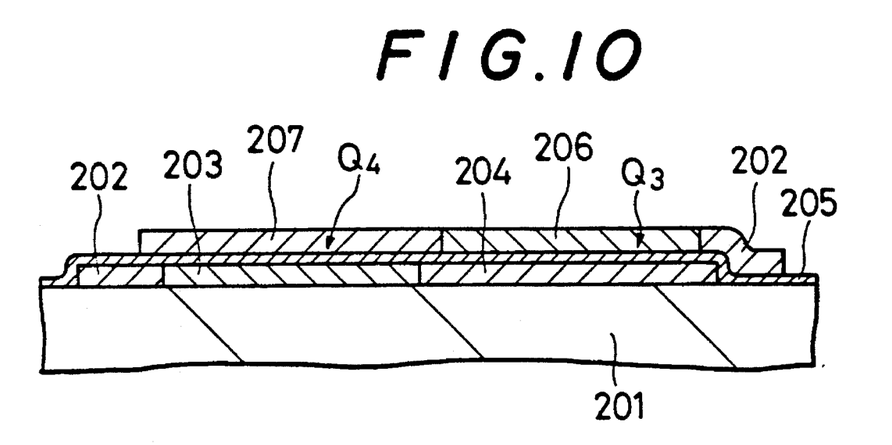
FIG. 10 is a sectional view showing the memory cell along a line X—X in FIG. 9.

FIGS. 9 and 10 schematically show a memory cell of a stacked full CMOS static RAM and, more particularly an arrangement of a load transistor, according to the first embodiment.

In FIGS. 9 and 10, reference numeral 201 denotes a semiconductor substrate; 202, a power source line for supplying a power source voltage $V_{DD}$; 203, an n-type channel region of the load transistor $Q_4$; and 204, a $p^+$-type drain region of the load transistor $Q_4$. In this case, the drain region 204 also serves as the gate electrode of the load transistor $Q_3$. Reference numeral 206 denote an n-type channel region of the load transistor $Q_3$; 207, a $p^+$-type drain region of the load transistor $Q_3$. In this case, the drain region 207 also serves as the gate electrode of the load transistor $Q_4$.

As shown in FIGS. 9 and 10, the drain region 207 serving as the gate electrode of the load transistor $Q_4$ entirely covers the channel region 203 of the load transistor $Q_4$. The channel region 206 of the load transistor $Q_3$ is formed entirely on the drain region 204 serving as the gate electrode of the load transistor $Q_3$.

The first to third embodiments of the present invention have been described in detail above, the present invention is not limited to the first to third embodiments, various modifications can be made on the basis of spirit and scope of the present invention.

For example, according to the first embodiment, the driver transistors $Q_1$ and $Q_2$ and the access transistors $Q_5$ and $Q_6$ constitute an LDD structure. However, the driver transistors $Q_1$ and $Q_2$ and the access transistors $Q_5$ and $Q_6$ do not necessarily have the LDD structure.

Figure 11:
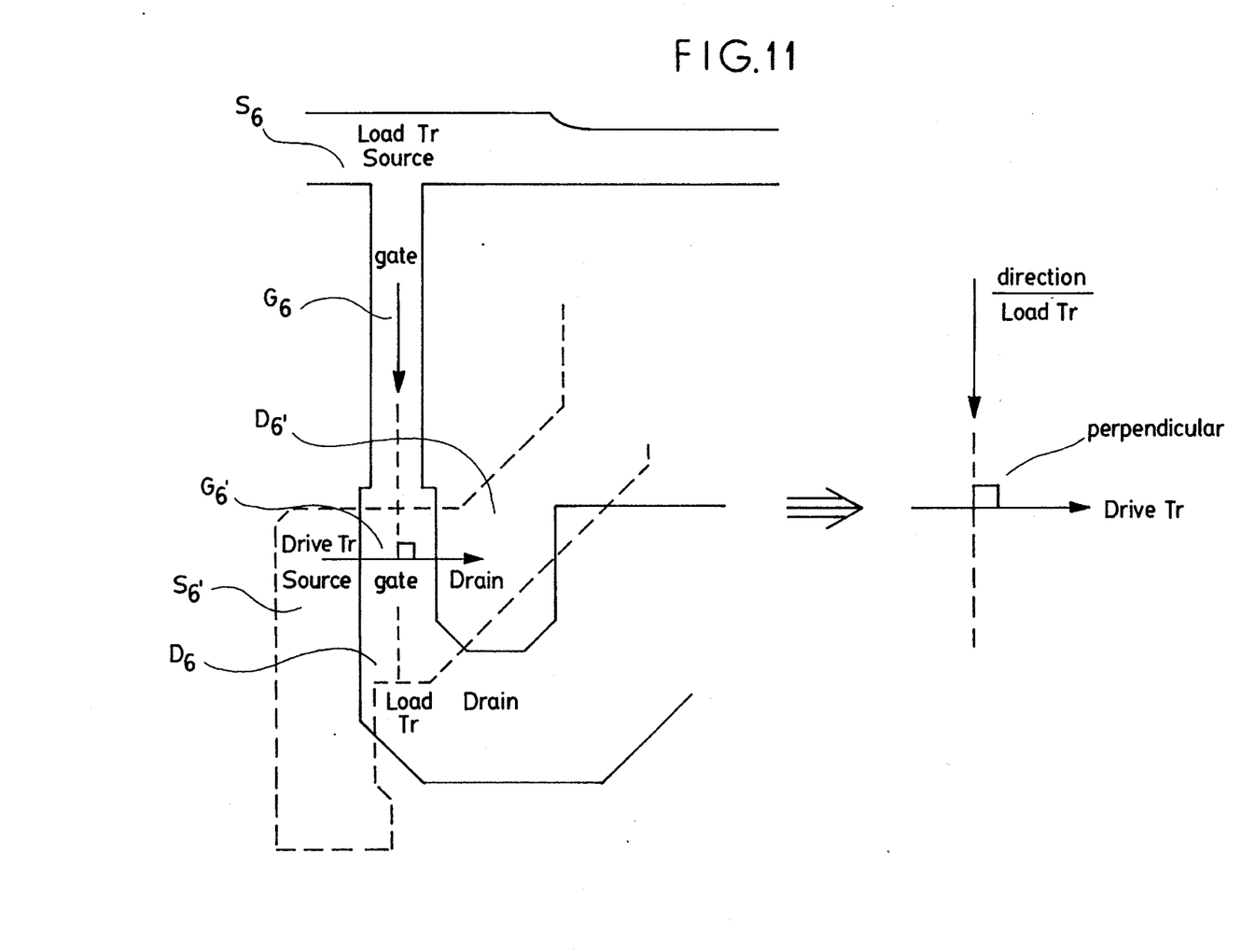
FIG. 11 is a partial sectional view taken from FIG. 2 illustrating the perpendicular relationship between the load transistor and the diver transistor.

FIG. 11 illustrates a partial sectional view of the relationship between the load transistor and the driver transistor. The source of the load transistor is illustrated at $S_6$, the gate at $G_6$, and the drain at 23. The driver transistor has its source illustrated at $S_6'$, its gate at $G_6'$ and its drain at $D_6'$. As illustrated in FIG. 2 and further illustrated in FIG. 11, the gate of the load transistor is perpendicular to the gate of the driver transistor.

It should be understood that various changes and modifications to the presently preferred embodiments described herein will be apparent to those skilled in the art. Such changes and modifications can be made without departing from the spirit and scope of the present invention and without diminishing its attendant advantages. It is, therefore, intended that such changes and modifications be covered by the appended claims.

What is claimed is:

1. A semiconductor memory comprising a memory cell having a flip-flop circuit consisting of a pair of driver transistors of a first conductivity type channel and a pair of load transistors of a second conductivity type channel, and a pair of access transistors, wherein said pair of load transistors of the second conductivity type channel are formed by semiconductor thin films and gate electrodes of said pair of load transistors of the second conductivity type channel are formed by semiconductor thin films of the second conductivity type and further wherein a dimension in length of the gate electrodes of said pair of load transistors is larger than a dimension in width of the gate electrodes of said pair of load transistors, a dimension in width of the gate electrodes of said pair of driver transistors is larger than a dimension in length of the gate electrodes of said pair of driver transistors, and the lengths of the gate electrodes of said pair of load transistors extend perpendicular to the lengths of the gate electrodes of said pair of driver transistors.

* * * * *